(12) United States Patent
Kotsubo et al.

(10) Patent No.: US 9,894,780 B2
(45) Date of Patent: Feb. 13, 2018

(54) METHOD OF MANUFACTURING RESIN MULTILAYER SUBSTRATE

(71) Applicant: Murata Manufacturing Co., Ltd., Nagaokakyo-shi, Kyoto-fu (JP)

(72) Inventors: Takuya Kotsubo, Nagaokakyo (JP); Shunsuke Chisaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 261 days.

(21) Appl. No.: 14/592,963

(22) Filed: Jan. 9, 2015

(65) Prior Publication Data
US 2015/0113802 A1    Apr. 30, 2015

Related U.S. Application Data

(63) Continuation of application No. PCT/JP2014/061032, filed on Apr. 18, 2014.

(30) Foreign Application Priority Data

May 16, 2013    (JP) .................................. 2013-103842

(51) Int. Cl.
H05K 3/46    (2006.01)
H05K 3/00    (2006.01)
H05K 3/40    (2006.01)

(52) U.S. Cl.
CPC .......... H05K 3/4632 (2013.01); H05K 3/005 (2013.01); H05K 3/4691 (2013.01);
(Continued)

(58) Field of Classification Search
CPC .... H05K 3/005; H05K 3/4053; H05K 3/4632; H05K 3/4691; H05K 2203/0191;
(Continued)

(56) References Cited

U.S. PATENT DOCUMENTS 4,081,600 A * 3/1978 Kueneman ........... H05K 3/4691
156/224
5,407,511 A    4/1995 Nakatani et al.
(Continued)

FOREIGN PATENT DOCUMENTS

JP    04-263486 A    9/1992
JP    2003-264369 A    9/2003
(Continued)

OTHER PUBLICATIONS

Official Communication issued in International Patent Application No. PCT/JP2014/061032, dated May 13, 2014.
(Continued)

*Primary Examiner* — A. Dexter Tugbang
(74) *Attorney, Agent, or Firm* — Keating & Bennett, LLP

(57) ABSTRACT

A method of manufacturing a resin multilayer substrate with a cavity, includes stacking insulation substrates including thermoplastic resins and thermocompression-bonding the insulation substrates. At least one of the insulation substrates is formed by affixing a peelable carrier film to one main surface of the insulation substrate, making a cut in the insulation substrate having the carrier film affixed thereto, the cut being designed to form the cavity, penetrating the insulation substrate in a thickness direction and not penetrating the carrier film in a thickness direction, and removing the carrier film and a portion of the insulation substrate that is cut out by the cut.

10 Claims, 6 Drawing Sheets

(52) U.S. Cl.
CPC ... *H05K 3/4053* (2013.01); *H05K 2203/0191* (2013.01); *H05K 2203/0228* (2013.01); *Y10T 29/49124* (2015.01); *Y10T 29/49126* (2015.01); *Y10T 29/49162* (2015.01); *Y10T 29/49165* (2015.01)

(58) Field of Classification Search
CPC ...... H05K 2203/0228; Y10T 29/49124; Y10T 29/49126; Y10T 29/49162; Y10T 29/49165
See application file for complete search history.

(56) References Cited

U.S. PATENT DOCUMENTS

| | | |
|---|---|---|
| 2003/0173105 A1 | 9/2003 | Kondo et al. |
| 2006/0042078 A1* | 3/2006 | Takeuchi ............. H05K 3/4632 29/830 |
| 2010/0163291 A1 | 7/2010 | Cho et al. |
| 2010/0288540 A1 | 11/2010 | Honjo et al. |
| 2011/0042124 A1* | 2/2011 | Matsui ................. H05K 3/4632 174/157 |
| 2011/0290540 A1 | 12/2011 | Jung et al. |
| 2012/0228005 A1 | 9/2012 | Chisaka |
| 2012/0235969 A1* | 9/2012 | Burns ............... Y10T 29/49165 345/211 |
| 2012/0293965 A1 | 11/2012 | Ochi et al. |

FOREIGN PATENT DOCUMENTS

| | | |
|---|---|---|
| JP | 2005-322838 A | 11/2005 |
| JP | 2009-170754 A | 7/2009 |
| JP | 2010118436 A * | 5/2010 |
| JP | 2012-243986 A | 12/2012 |
| WO | 2011/058879 A1 | 5/2011 |
| WO | 2011/062146 A1 | 5/2011 |

OTHER PUBLICATIONS

Official Communication issued in corresponding Japanese Patent Application No. 2014-542029, dated Oct. 21, 2014.

* cited by examiner

METHOD OF MANUFACTURING RESIN MULTILAYER SUBSTRATE

BACKGROUND OF THE INVENTION

1. Field of the Invention

The present invention relates to a method of manufacturing a resin multilayer substrate.

2. Description of the Related Art

A resin multilayer substrate having a rigid portion and a flexible portion is known. Such a resin multilayer substrate consists of a flexible portion (a portion that is thinner or has fewer layers and higher flexibility) and a rigid portion (a portion that is thicker or has more layers and lower flexibility). The rigid portion is different from the flexible portion in a number of insulation substrates or in a composition material of the insulation substrate. Furthermore, as a method of manufacturing a resin multilayer substrate, there is a known method by which resin sheets, each made of a thermoplastic resin and having a conductor pattern formed thereon are stacked, then heated and pressurized by a heat pressing plate, and collectively bonded as a stacked body.

Japanese Patent Laying-Open No. 2003-264369 discloses a method of manufacturing a via-filled single-sided conductor pattern film. The method includes the steps of: affixing a PET film to a single-sided conductor (Cu) pattern resin film; providing a via hole by a laser beam from the PET film side and charging an interlayer connection material (via paste); and making a cut in a boundary between a rigid portion and a flexible portion, in which the cut is made in a length equal to or greater than the width of a product.

In Japanese Patent Laying-Open No. 2003-264369, however, a cut for forming a cavity is made after via paste is charged. Accordingly, due to vibration caused by cutting and conveyance, the via conductor tends to spatter or fall off, which leads to short-circuit defects or electric connection failures in a via. It is to be noted that this manufacturing method does not allow a film (for example, a PET film) functioning as a mask for via filling to be conveyed in the state where this film is held as a carrier film.

In addition, Japanese Patent Laying-Open No. 2005-322838 discloses a method of manufacturing a flexible wiring substrate equipped with a stiffening plate. In this manufacturing method, the surface side (pattern side) of the flexible wiring plate is affixed to a slightly adhesive film, and the flexible wiring plate is half-cut from its back surface side while using the slightly adhesive film as a carrier, thereby cutting the flexible wiring plate in a prescribed shape without cutting the slightly adhesive film. However, Japanese Patent Laying-Open No. 2005-322838 does not describe a manufacturing method of performing via filling, and also does not provide a carrier film functioning as a mask for via filling.

SUMMARY OF THE INVENTION

Preferred embodiments of the present invention provide methods of manufacturing a resin multilayer substrate that prevent undulation or the like of an insulation substrate during conveyance, and also significantly reduce or prevent spattering and falling off of a via-hole conductor.

According to a preferred embodiment of the present invention, a method of manufacturing a resin multilayer substrate including a cavity, includes the steps of stacking a plurality of insulation substrates including thermoplastic resins and thermocompression-bonding the plurality of insulation substrates. At least one insulation substrate of the plurality of insulation substrates is manufactured by a method including affixing a peelable carrier film to one main surface of the insulation substrate; making a cut in the insulation substrate having the carrier film affixed thereto, the cut being designed to form the cavity, penetrating the insulation substrate in a thickness direction and not penetrating the carrier film in a thickness direction; and removing the carrier film and a portion of the insulation substrate that is cut out by the cut.

It is preferable to further include forming a through hole for a via hole in the insulation substrate having the carrier film affixed thereto from a carrier film side after the affixing step and before the cutting step; and charging a conductive material into the through hole for a via hole from the carrier film side after the cutting step and before the removing step.

It is preferable that the cut is made in the cutting step such that a portion of the insulation substrate that is cut out by the cut is configured so as to include at least one corner portion having a circumference portion having a prescribed radius of curvature.

It is preferable that the conductive material is conductive paste that is charged so as to protrude from the insulation substrate.

It is preferable that a conductor wiring layer is formed on a main surface of the insulation substrate on a side opposite to the carrier film.

According to various preferred embodiments of the present invention, in manufacturing a resin multilayer substrate, a cut for forming a cavity is made in the state where a carrier film is held in an insulation substrate (insulation sheet) before the subsequent conveyance is carried out. Accordingly, undulation or the like of the insulation substrate during conveyance thereof is significantly reduced or prevented. Therefore, it becomes possible to significantly reduce or prevent problems such as misalignment in stacking that occurs at the time when insulation substrates are stacked.

Furthermore, when a via-hole conductor is formed in an insulation substrate, a cut for forming a cavity is made in the state where a carrier film is held in the insulation substrate before paste for a via-hole conductor is charged. Accordingly, spattering and falling off of the paste for via-hole conductor are significantly reduced or prevented. Consequently, it becomes possible to significantly reduce or prevent the occurrence of short defects in a resin multilayer substrate and the occurrence of electric connection failures in a via-hole conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
FIGS. 1A-1F are schematic cross-sectional views for illustrating each step of a method of manufacturing a resin multilayer substrate according to a first preferred embodiment of the present invention.

Preferred embodiments of a method of manufacturing a resin multilayer substrate according to the present invention will be described with reference to the drawings. In the accompanying drawings of the present invention, the same or corresponding components are designated by the same reference characters. Furthermore, the dimensional relation of a length, a width, a thickness, a depth and the like is modified as appropriate for the purpose of clarifying and simplifying each figure, and not represented in the actual dimensional relation.

First Preferred Embodiment

An example of the present invention will be described with reference to FIGS. 1A-1F and 2G-2I.

First, as shown in FIG. 1A, a conductor layer 2 is formed on one surface of an insulation substrate (insulation sheet) 1, and a carrier film 3 is affixed to the other surface thereof such that it can be peeled off. It is preferable that the carrier film has a certain retaining ability but also has slight adhesiveness by which excessive force is not required when this carrier film is peeled off.

Insulation substrate 1 includes a thermoplastic resin. The thermoplastic resin may be polyimide, a liquid crystal polymer (LCP), polyether ketone resin (PEEK), and polyphenylene sulfide resin (PPS), for example. In the case where the insulation substrate includes a thermoplastic resin, it is desirable that a heat treatment during pressing (collective thermocompression bonding) or the like after stacking is carried out at a relatively low temperature since resin tends to readily flow out due to the heat treatment.

Conductor layer 2 can be made, for example, using a conductive foil made of copper, silver, aluminum, SUS (stainless used steel), nickel, gold, or an alloy thereof, in which case copper is preferable. The thickness of the conductor layer is not particularly limited as long as it can form a circuit, and can be adjusted as appropriate, and preferably within a range of about 3 μm to about 40 μm (for example, about 12 μm), for example. Furthermore, the conductive foil may be subjected on its one side to a roughening treatment in order to improve adhesiveness to a thermoplastic resin film. The surface roughness (Rz) of the roughened surface preferably is about 1 μm to about 15 μm, for example. In this case, when the conductive foil bites into the thermoplastic resin film, joining between the conductive foil and the thermoplastic resin film is improved.

Carrier film 3 is preferably made of polyethylene terephthalate (PET), or can be made using polyethylene naphthalate (PEN) or the like. The thickness of the carrier film is preferably about 10 μm to about 150 μm, and for example, about 75 μm.

Then, conductor layer 2 is patterned using a known circuit formation method such as photolithography processing, to form a conductor wiring layer including a connection pad and circuit wiring.

Figure 1B:
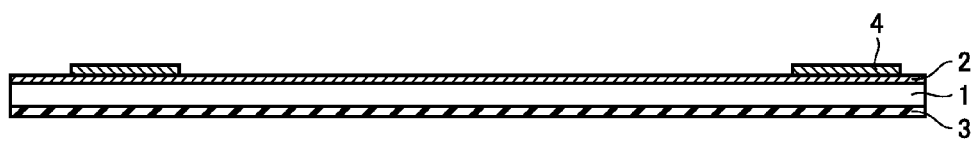
Figure 1C:
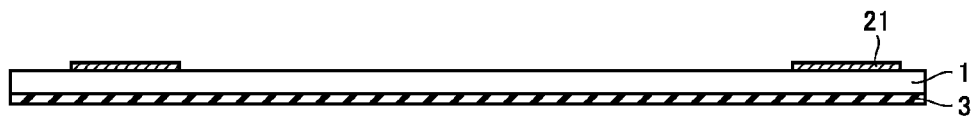

Specifically, as shown in FIG. 1B, a resist 4 is first formed on conductor layer 2. Then, an unnecessary portion of conductor layer 2 is removed by the photolithography method or the like, and then, resist 4 is removed. As a result, a conductor wiring layer 21 having a desired pattern is formed (FIG. 1C).

The method of forming a conductor wiring layer is not limited to the above-described method, but can be various known methods, and for example may be: a method by which a conductive foil is bonded onto the surface of an insulation substrate or a conductive foil is directly overlaid (laminated) on the surface of the insulation substrate without using an adhesive, which is then subjected to etching to form a wiring circuit; a method of transferring a conductive foil formed in the shape of a wiring circuit to an insulation substrate; and a method of forming a circuit on the surface of an insulation substrate by a metal plating method.

Figure 1D:
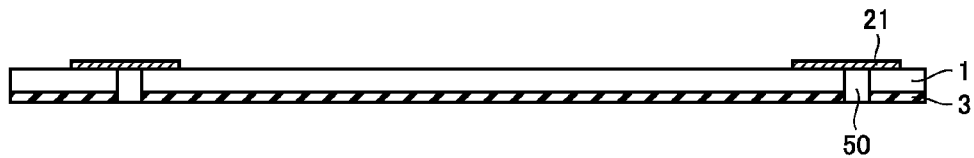

Then, as shown in FIG. 1D, a through hole for via hole 50 is formed at a prescribed position of insulation substrate 1 having conductor wiring layer 21 formed thereon and having carrier film 3 affixed thereto. A through hole for via hole 50 is formed, for example, by a method of applying carbon dioxide gas laser from the carrier film 3 side (the side opposite to the surface on which conductor wiring layer 21 is formed) to provide holes, or the like. Then, smears (resin residues) remaining inside the through hole for the via hole that are produced by laser processing are removed as required by a general-purpose chemical liquid treatment or the like using permanganic acid or the like.

Figure 1E:
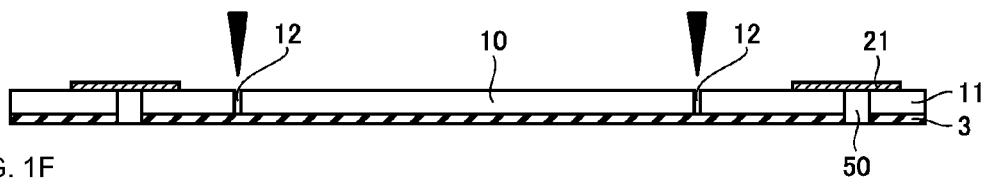

Then, as shown in FIG. 1E, a cut 12 for cutting out a portion of the insulation substrate (an unnecessary portion 10) is made, for example, in order to reduce the thickness of the insulation substrate to form a cavity in a portion or the like at which a flexible portion needs to be formed. In the manufacturing method of the present preferred embodiment, before the subsequent conveyance is carried out, a cut for forming a cavity is made in the state where a carrier film is held in the insulation substrate. Thus, the insulation substrate is conveyed in the state where the entire surface of the insulation substrate is lined with the carrier film. Accordingly, undulation or the like of the insulation substrate during conveyance thereof is significantly reduced or prevented. Therefore, it becomes possible to significantly reduce or prevent problems such as misalignment in stacking that occurs while insulation substrates are stacked. Furthermore, when a via-hole conductor is formed in the insulation substrate, a cut for forming a cavity is made in the state where the carrier film is held in the insulation substrate before paste for the via-hole conductor is charged. Accordingly, spattering and falling off of the paste for via-hole conductor are significantly reduced or prevented. In other words, when a cavity is formed in advance in the insulation substrate, the insulation substrate tends to readily undulate (deform). Thus, when the carrier film is peeled off after the paste for via-hole conductor is charged, the insulation substrate may deform to cause the conductive paste charged into the through hole for via hole to be taken away by the carrier film or to be spattered therearound. In the present preferred embodiment, since the carrier film and the insulation substrate remain at a position of the cavity in the insulation substrate, the tendency of the insulation substrate to deform is significantly reduced or prevented. Therefore, falling off and spattering of paste from the through hole for via hole are significantly reduced or prevented while the carrier film is peeled off. Consequently, it becomes possible to significantly reduce or prevent the occurrence of short defects in a resin multilayer substrate and the occurrence of electric connection failures in a via-hole conductor.

Figure 5A:
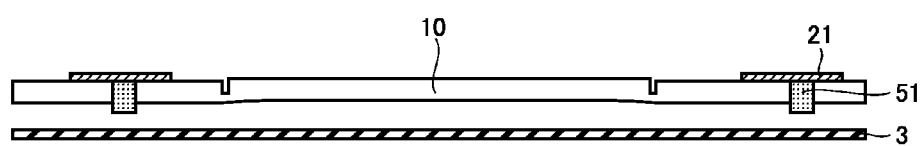
FIGS. 5A and 5B are schematic cross-sectional views for illustrating a cutting step according to the first preferred embodiment of the present invention.

Cut 12 formed in this case needs to penetrate insulation substrate 1 in the thickness direction. This is because, if cut 12 does not penetrate insulation substrate 1, unnecessary portion 10 that is to define a cavity cannot be separated, with the result that a cavity cannot be reliably formed (see FIG. 5A). In addition, a cut does not necessarily need to be made in a portion of the carrier film. However, in order to make a cut so as to penetrate through the entire insulation substrate, a cut is to be made in a portion of the carrier film (which is not shown in FIG. 1E) almost inevitably in consideration of the balance with the cutting accuracy.

Figure 5B:
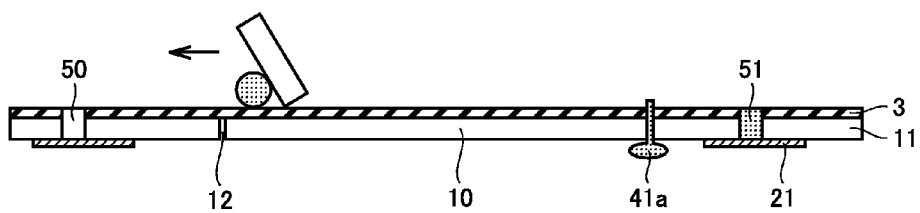

It is to be noted that cut 12 should not penetrate carrier film 3. In the case where cut 12 penetrates carrier film 3, bleed-out 41a of the paste for via-hole conductor occurs through cut 12 (in a portion other than through hole for via hole 50) (see FIG. 5B) when paste for via-hole conductor 51 is charged using carrier film 3 as a mask in the step of charging a conductive material (paste for via-hole conductor) (FIG. 1F) described later.

In the cutting step, for example, using a press working machine equipped with a pinnacle die, a cut is made from the surface of the insulation substrate on the side opposite to the carrier film (the circuit formation layer side) such that the cut extends part of the way through the carrier film in the thickness direction. The expression of "part of the way through the carrier film in the thickness direction" means the position inside the carrier film in its thickness direction excluding both main surfaces of the carrier film. The distance between this position and one main surface of the carrier film is preferably about one-fourth to about three-fourth of the thickness of the carrier film, and most preferably, about one-half of the thickness of the carrier film. If the cut is set to a depth to fall within such a range, it becomes possible to stably make a cut that penetrates the insulation substrate in its thickness direction but does not penetrate the carrier film in its thickness direction.

Furthermore, by making a cut penetrating the insulation substrate in its thickness direction but not penetrating the carrier film in its thickness direction in this way, the insulation substrate is entirely connected during via filling or conveyance, so that undulation or the like of the insulation substrate occurring during conveyance is significantly reduced or prevented.

Figure 1F:
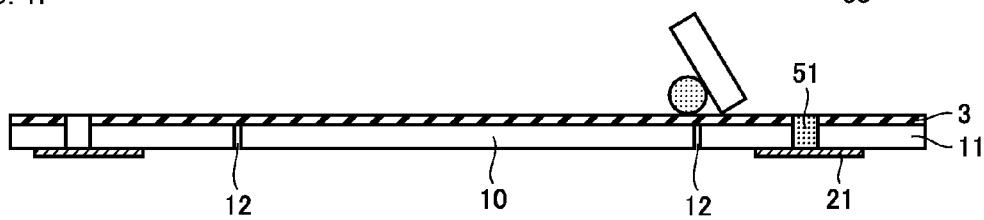

Then, insulation substrate 1 having cut 12 made therein as shown in FIG. 1E is turned upside down, and conductive material (paste for via-hole conductor) 51 is charged into through hole for via hole 50 by the screen printing method, the vacuum filling method, or the like (FIG. 1F). In this case, since cut 12 does not penetrate carrier film 3 as described above, bleeding of conductive material (paste for via-hole conductor) 51 to the conductor wiring layer 21 side does not occur.

A conductive material can be various known materials, and for example may be a conductive paste obtained by kneading a metal component and a flux component. A metal component is metal powder that exists in the state where it is distributed through paste, for example. A flux component can be various known flux components each used as a material of conductive paste, and for example may be a vehicle, a solvent, a thixotropic agent, an activator, and the like. It is preferable that conductive paste is made by blending a proper amount of such metal powder as forming an alloy layer with metal of the conductor wiring layer at a bonding temperature (the temperature during collective thermocompression bonding after stacking).

Figure 2G:
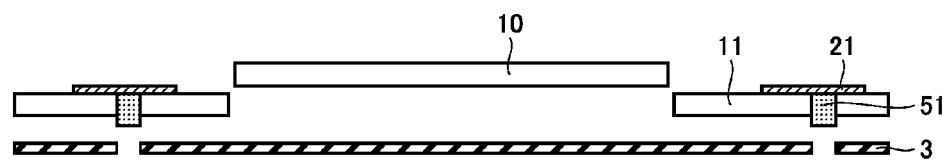
FIGS. 2G-2I are schematic cross-sectional views for illustrating each step subsequent to FIGS. 1A-1F.

Then, as shown in FIG. 2G, after removal of carrier film 3 or simultaneously with removal of carrier film 3, a portion of the insulation substrate that is cut out by cut 12 (unnecessary portion 10) is removed.

It is to be noted that unnecessary portion 10 described herein may be a portion surrounded by one closed cut within a plane of the main surface of the insulation substrate or may be a portion surrounded by a combination of cut 12 and the outer circumference of insulation substrate 1 within the same plane. In other words, the cavity in a preferred embodiment of the present invention may be a closed space within a plane of the main surface of the insulation substrate or may be a partially opened space within the same plane. When the proportion of the opened portion of the space is relatively high in the latter case, the cavity is generally rather represented as a step in many cases, but the cavity in a preferred embodiment of the present invention shall also include such a step.

Figure 3:
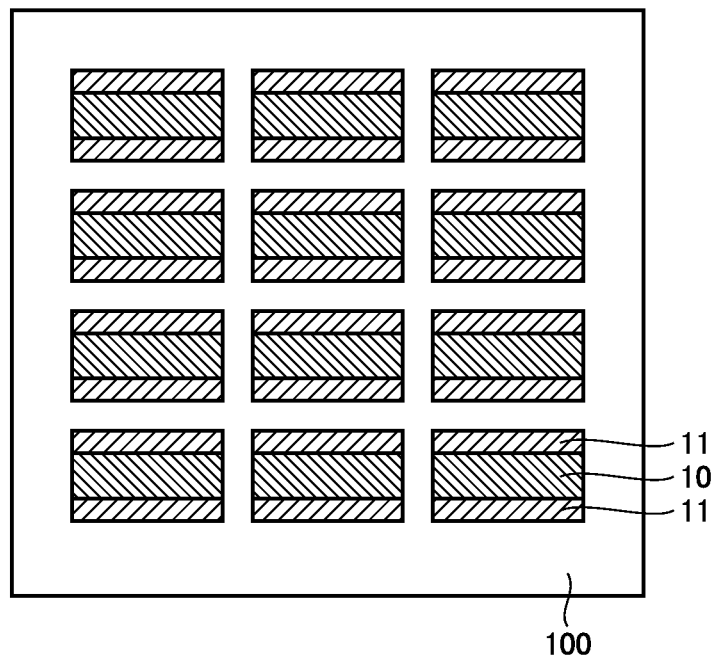
FIG. 3 is a schematic top plan view for illustrating manufacture of an insulation substrate according to the first preferred embodiment of the present invention.

As to insulation substrate 11 including such unnecessary portion 10, a plurality of insulation substrates 11 are simultaneously fabricated from a substrate base material 100 in practical cases, as shown in FIG. 3. According to the conventional manufacturing method, particularly in a space between insulation substrates 1a, undulation tends to readily occur during conveyance when unnecessary portion 10 for forming a cavity is hollowed out.

Figure 2H:
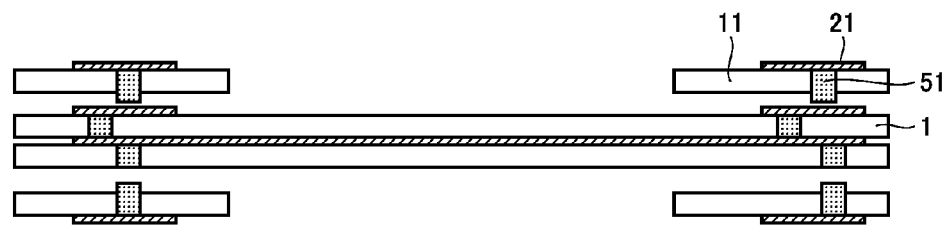
Figure 4:
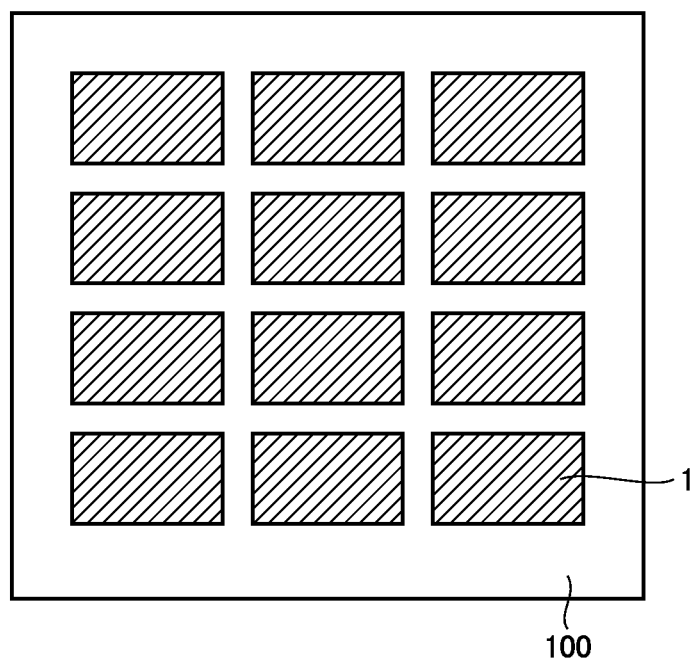
FIG. 4 is a schematic top plan view for illustrating manufacture of another insulation substrate according to the first preferred embodiment of the present invention.

Then, (one or more than one) insulation substrate 11 partially hollowed out that has been fabricated as described above and (one or more than one) insulation substrate 1 not hollowed out are stacked as shown in FIG. 2H. In addition, as to insulation substrate 1 that is not hollowed out, a plurality of insulation substrates 1 are simultaneously fabricated from substrate base material 100, as shown in FIG. 4.

Furthermore, in the present preferred embodiment, since a conductive material is charged through the carrier film, conductive material 51 protrudes by the thickness of carrier film 3 from insulation substrate 11 (a conductive material may further be charged excessively with respect to the volume of the via hole so as to further protrude). Accordingly, in the subsequent thermocompression bonding step, an excellent joint between conductive material 51 and conductor wiring layer 21 is achieved, thus improving the interlayer connection reliability. Furthermore, even if the via is decreased in size, the interlayer connection is readily achieved. Accordingly, vias arranged in high density contribute to a decrease in size of a resin multilayer substrate.

Then, a plurality of stacked insulation substrates 1 and 11 are pressurized in the stacking direction while being heated. In this way, insulation substrates are bonded to each other without providing an adhesive (layer). In addition, it is preferable that the insulation substrate forming a flexible portion and the insulation substrate forming a rigid portion are made of the same thermoplastic resin.

In addition, paste for via-hole conductor 51 charged into the through hole for via hole 50 is metalized by the heat produced at the time of this thermocompression bonding, to obtain via-hole conductor 52.

Figure 2I:
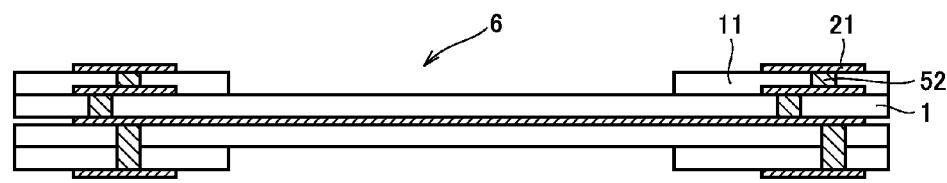

Furthermore, by cooling a plurality of insulation substrates 1 subjected to thermocompression bonding, a resin multilayer substrate as shown in FIG. 2I can be produced.

It is to be noted that plating of a surface electrode, loading of a mounted component and the like may be subsequently carried out as required.

As compared with the conventional build-up construction method, the manufacturing method of the present preferred embodiment is significantly improved in productivity and stacking accuracy, and therefore, achieves excellent cost benefits.

Furthermore, in terms of the via forming method, plating processing after providing a through hole by punching is generally performed, which however poses problems such as low productivity, cost increase, and difficulty in size reduction. Therefore, according to the method of performing collective thermocompression bonding after charging the paste for via-hole conductor as in the manufacturing method of the present preferred embodiment, these problems are advantageously solved.

Second Preferred Embodiment

Figure 6A:
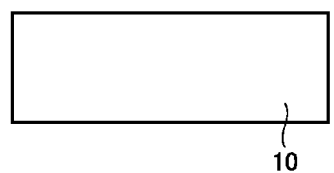
FIGS. 6A and 6B are schematic top plan views for illustrating the shape of a corner portion according to a second preferred embodiment of the present invention.
Figure 6B:
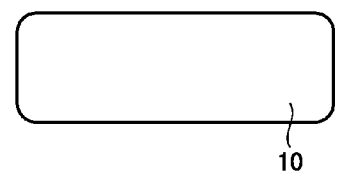

According to the present preferred embodiment, a portion of the insulation substrate that is cut out by a cut (unnecessary portion 10) has a shape (a cavity portion) including at least one corner portion that has a circumference portion having a prescribed radius of curvature R (FIG. 6B). In FIG. 6B, the corners of the shape as shown in FIG. 6A are rounded such that the corners are eliminated. The present preferred embodiment is different in this feature from the first preferred embodiment, but preferably identical in other features to the first preferred embodiment. It is to be noted that the shape described herein means the shape as viewed from the normal direction of the main surface of the insulation substrate.

Figure 7:
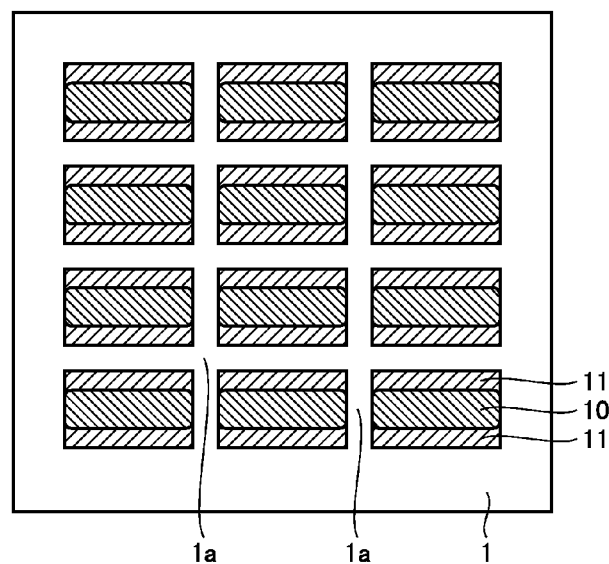
FIG. 7 is a schematic top plan view for illustrating manufacture of an insulation substrate according to the second preferred embodiment of the present invention.

In addition, as to insulation substrate 11 including unnecessary portion 10 having the shape as described above, a plurality of insulation substrates 11 are simultaneously fabricated from substrate base material 100, as shown in FIG. 7.

Figure 8:
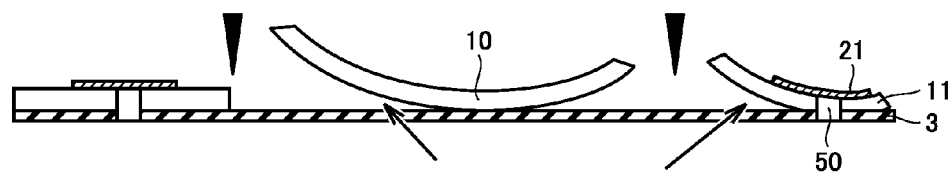
FIG. 8 is a schematic cross-sectional view for illustrating an effect achieved by the second preferred embodiment of the present invention.

When at least one or more of corners (corner portions) of a cut portion (unnecessary portion 10) are rounded (each shaped to have a circumference portion having a prescribed radius of curvature R), peeling off of insulation substrates 10 and 11 from carrier film 3 as shown in FIG. 8 (portions indicated by arrows in FIG. 8) is prevented during conveyance after the cutting step, and the like.

Figure 9:
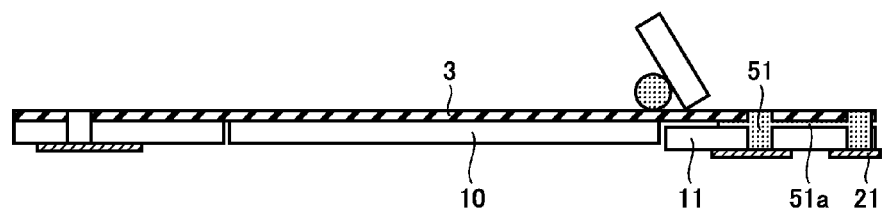
FIG. 9 is another schematic cross-sectional view for illustrating the effect achieved by the second preferred embodiment of the present invention.
Figure 10:
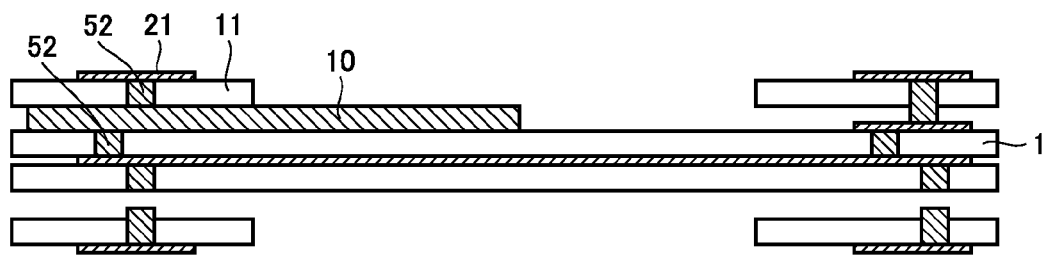
FIG. 10 is still another schematic cross-sectional view for illustrating achieved by the second preferred embodiment of the present invention.

Furthermore, as shown in FIG. 9, when insulation substrate 11 is peeled off to a via, bleeding 51a of conductive material 51 spreads to the portion where insulation substrate 11 peels off, which may cause a short circuit to occur between adjoining via conductors. However, such a short circuit is also be prevented. Furthermore, when insulation substrates are stacked in the state where unnecessary portion 10 of one of the insulation substrates completely peels off from carrier film 3 and adheres to another portion of the insulation substrate with static electricity, thus resulting in the state where unnecessary portion 10 of the insulation substrate is disposed between via-hole conductors 52 as shown in FIG. 10, line disconnection may occur inside the resin multilayer substrate, or undesirable depressions and projections may be provided in the resin multilayer substrate. These phenomena are also significantly reduced or prevented.

Radius of curvature R of the corner portion described above is not particularly limited, but preferably is about 0.1 mm to about 1.0 mm, and more preferably about 0.5 mm, for example. In the case where R is less than about 0.1 mm, the effects for uplift/peeling off cannot be expected. In the case where R is greater than about 1.0 mm, the effects for uplift/peeling off are achieved, but product size reduction may be affected.

It should be understood that the preferred embodiments disclosed herein are illustrative and non-restrictive in every respect. The scope of the present invention is defined by the terms of the claims, rather than the description above, and is intended to include any modifications within the meaning and scope equivalent to the terms of the claims.

For example, in the first preferred embodiment, a cavity is preferably provided in the flexible portion of the resin multilayer substrate, but may be provided in the rigid portion thereof. Furthermore, a cavity may be used, for example, as a cavity for housing an incorporated component. In other words, the present invention does not have to be a resin multilayer substrate including a rigid portion and a flexible portion, but can be applied to a resin multilayer substrate including a cavity.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method of manufacturing a resin multilayer substrate including a cavity, the method comprising the steps of:
    stacking a plurality of insulation substrates including thermoplastic resins; and
    thermocompression-bonding the plurality of insulation substrates;
    wherein at least one insulation substrate of the plurality of insulation substrates is manufactured by a method including:
    affixing a peelable carrier film to one main surface of the at least one insulation substrate;
    forming a through hole for a via hole in the at least one insulation substrate having the carrier film affixed to the one main surface of the at least one insulation substrate from a carrier film side;
    making a cut in the at least one insulation substrate from a surface opposite to the one main surface of the at least one insulation substrate and having the carrier film affixed to the at least one insulation substrate with the through hole, the cut being designed to form the cavity, penetrating the at least one insulation substrate in a thickness direction and not penetrating the carrier film in a thickness direction of the carrier film;
    charging a conductive material into the through hole for the via hole in the at least one insulation substrate from the carrier film side; and
    removing the carrier film and a portion of the at least one insulation substrate that is cut out by the cut after charging the conductive material.

2. The method of manufacturing a resin multilayer substrate according to claim 1, wherein the cut is made in the cutting step such that the portion of the at least one insulation substrate that is cut out by the cut is configured so as to include at least one corner portion having a circumference portion having a prescribed radius of curvature as viewed from a normal direction of the main surface of the insulation substrate.

3. The method of manufacturing a resin multilayer substrate according to claim 2, wherein at least one corner portion of the cut is rounded.

4. The method of manufacturing a resin multilayer substrate according to claim 2, wherein the cut is configured to form a plurality of the corner portions that are rounded.

5. The method of manufacturing a resin multilayer substrate according to claim 1, wherein the conductive material is conductive paste that is charged so as to protrude from the insulation substrate.

6. The method of manufacturing a resin multilayer substrate according to claim 1, wherein a conductor wiring layer is formed on a main surface of the insulation substrate on a side opposite to the carrier film.

7. The method of manufacturing a resin multilayer substrate according to claim 1, further comprising conveying the at least one insulation substrate while an entire surface of the at least one insulation substrate is lined with the carrier film.

8. The method of manufacturing a resin multilayer substrate according to claim 1, wherein the carrier film and the insulation substrate remain at the position of the cavity after the step of making the cut.

9. The method of manufacturing a resin multilayer substrate according to claim 1, wherein the removing of the portion of the at least one insulation substrate that is cut out is performed after removal of the carrier film, or simultaneously with removal of the carrier film.

10. The method of manufacturing a resin multilayer substrate according to claim 1, wherein the cavity is one of a closed space within a plane of the one main surface of the at least one insulation substrate and a partially opened space within the plane of the one main surface of the at least one insulation substrate.

* * * * *